US012687585B2

(12) United States Patent
Kim et al.

(10) Patent No.: US 12,687,585 B2
(45) Date of Patent: Jul. 21, 2026

(54) NON-DESTRUCTIVE METHOD FOR DETECTING FAILURE OF CELL

(71) Applicant: LG ENERGY SOLUTION, LTD., Seoul (KR)

(72) Inventors: Youngdeok Kim, Daejeon (KR); Daesoo Kim, Daejeon (KR); Joonhyeon Kang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 395 days.

(21) Appl. No.: 18/281,835

(22) PCT Filed: Nov. 18, 2022

(86) PCT No.: PCT/KR2022/018344
§ 371 (c)(1),
(2) Date: Sep. 13, 2023

(87) PCT Pub. No.: WO2023/101283
PCT Pub. Date: Jun. 8, 2023

(65) Prior Publication Data
US 2024/0310454 A1 Sep. 19, 2024

(30) Foreign Application Priority Data
Dec. 2, 2021 (KR) ........................ 10-2021-0171212

(51) Int. Cl.
*G01R 31/392* (2019.01)
*G01N 23/207* (2018.01)
*G01R 31/36* (2020.01)

(52) U.S. Cl.
CPC ......... *G01R 31/392* (2019.01); *G01N 23/207* (2013.01); *G01R 31/3648* (2013.01)

(58) Field of Classification Search
CPC . G01R 31/392; G01R 31/3648; G01N 23/207
See application file for complete search history.

(56) References Cited

U.S. PATENT DOCUMENTS 9,778,212 B2 10/2017 Tessema et al.
2005/0058247 A1 * 3/2005 Taguchi .............. G01N 23/207
378/71
(Continued)

FOREIGN PATENT DOCUMENTS

CN 111103398 A 5/2020
JP 2005114440 A 4/2005
(Continued)

OTHER PUBLICATIONS

International Search Report issued Feb. 20, 2023 with Written Opinion in the corresponding International Patent Application No. PCT/KR2022/018344.
(Continued)

*Primary Examiner* — Keith D Bloomquist
(74) *Attorney, Agent, or Firm* — Morgan, Lewis & Bockius LLP

(57) ABSTRACT

A method for non-destructively detecting failure of a cell is disclosed. The method may include preparing a cell containing a carbon-based material as an anode active material, charging the cell, x-ray diffraction (XRD) scanning the charged cell inward from an end of an anode, and determining whether or not an $LiC_6$ peak of the anode is observed in a region after a signal of an anode current collector appears in XRD scans.

12 Claims, 5 Drawing Sheets

300

(56)　　　　References Cited

U.S. PATENT DOCUMENTS

| | | | |
|---|---|---|---|
| 2013/0271089 A1 | 10/2013 | Yazami et al. | |
| 2013/0337335 A1* | 12/2013 | Kim ...................... | C01G 19/02 |
| | | | 427/113 |
| 2015/0204803 A1 | 7/2015 | Bansil et al. | |
| 2016/0123906 A1* | 5/2016 | Tessema .............. | G01N 23/207 |
| | | | 250/395 |
| 2016/0172670 A1 | 6/2016 | Friend | |
| 2016/0218351 A1* | 7/2016 | Dudney ................ | H01M 4/133 |
| 2017/0141380 A1* | 5/2017 | Aoki ................. | H01M 10/0525 |
| 2020/0350637 A1 | 11/2020 | You et al. | |

FOREIGN PATENT DOCUMENTS

| | | |
|---|---|---|
| JP | 2014-143164 A | 8/2014 |
| JP | 2015-138027 A | 7/2015 |
| JP | 2016-051642 A | 4/2016 |
| JP | 2016-109654 A | 6/2016 |
| JP | 6515695 B2 | 5/2019 |
| JP | 2020-085690 A | 6/2020 |
| KR | 10-2016-0060036 A | 5/2016 |
| KR | 10-2019-0023817 A | 3/2019 |
| WO | 2016/021614 A1 | 2/2016 |

OTHER PUBLICATIONS

Tardiff et al., "Combining operando X-ray experiments and modelling to understand the heterogeneous lithiation of graphite electrodes", Journal of Materials Chemistry A, vol. 9, Iss. 7, (2021) pp. 4281-4290.

Noh et al., "Role of Li6CoO4 Cathode Additive in Li-Ion Cells Containing Low Coulombic Efficiency Anode Material", Journal of the Electrochemical Society, vol. 159, Iss. 8, (2012) pp. A1329-A1334.

Extended European Search Report dated Jul. 23, 2024 issued in European Patent Application No. 22901641.5.

Notice of Allowance dated Sep. 9, 2024 issued in Japanese Patent Application No. 2023-552241.

Senyshyn, A., et al., "Uniformity of Flat Li-Ion Batteries Studied by Diffraction and Imaging of X-rays and Neutrons", ACS Applied Energy Materials, vol. 4, No. 4, Apr. 26, 2021, pp. 3110-3117.

Senyshyn, A., et al., "Uniformity of flat Li-ion batteries studied by diffraction and imaging of X-rays and neutrons", ACS Applied Energy Materials, vol. 4, No. 4, Apr. 26, 2021, pp. 51-53.

Wilhelm, J., et al., "Cycling capacity recovery effect: A coulombic efficiency and postmortem study", Journal of Power Sources, vol. 365, Sep. 4, 2017, pp. 327-338.

Bak, et al., "In situ/operando synchrotron-based X-ray techniques for lithium-ion battery research", NPG Asia Materials, vol. 10, No. 7, Jul. 1, 2018, pp. 563-580.

Zhu Zhendong, et al., Analysis of lithium plating-stripping process in lithium-ion batteries by three-electrode measurements, Energy Storage Science and Technology, Mar. 2021, pp. 448-453.

Li, Jia Yang, et al., Research on Structure Variation of Electrode Active Material during Charge-discharge for Graphite/LiCoO2 Battery, Acta Chimica Sinica, 2010, 68 (07).

Office Action dated Mar. 25, 2026 issued in the corresponding Chinese Patent Application No. 202280018499.1.

* cited by examiner

【FIG. 4】
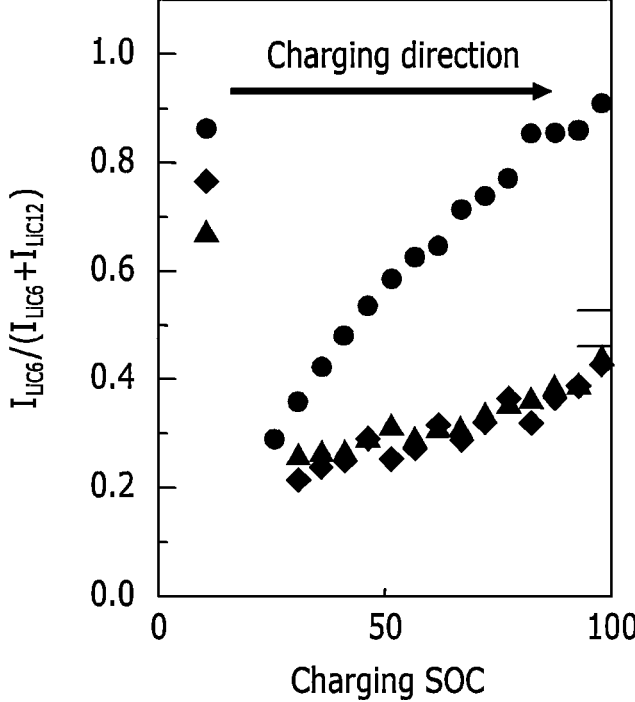

【FIG. 5】
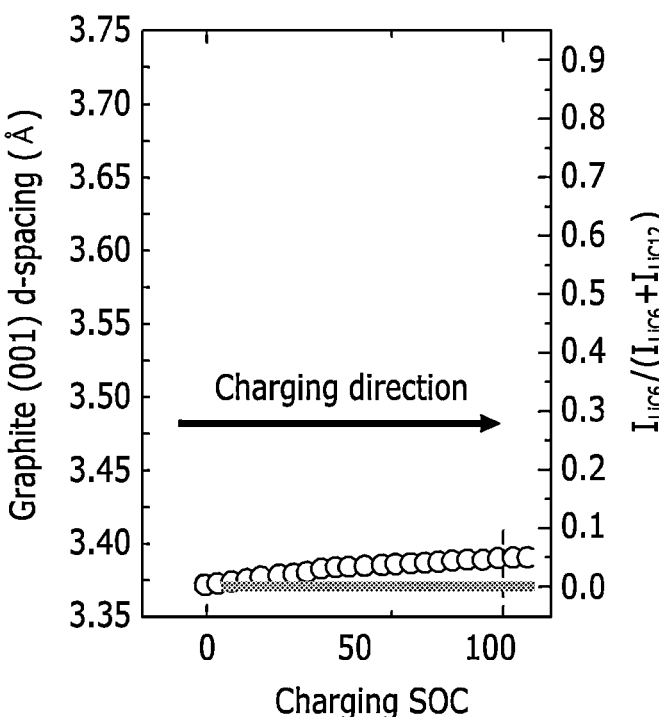

NON-DESTRUCTIVE METHOD FOR DETECTING FAILURE OF CELL

CROSS CITATION WITH RELATED APPLICATION(S)

This application claims the benefit of Korean Patent Application No. 10-2021-0171212 filed on Dec. 2, 2021 with the Korean Intellectual Property Office, the entire contents of which are incorporated herein by reference.

TECHNICAL FIELD

The present disclosure relates to a non-destructive method for detecting failure of a cell.

BACKGROUND

With the technology development and increased demand for mobile devices, demand for secondary batteries as energy sources has been rapidly increasing. Among such secondary batteries is a lithium secondary battery exhibiting a high energy density and operating voltage, a long cycle lifespan, and a low self-discharge rate, which is now commercialized and widely used.

Also, in recent years, design of electronic devices has been acted very important elements in product selection by consumers, and the electronic devices have been gradually miniaturized and thinned according to the taste of consumers. For this purpose, there is a high necessity for miniaturizing and thinning a lithium secondary battery in order to minimize unnecessary waste of an internal space of each of the electronic devices. In addition, it is necessary for the lithium secondary battery to have various shapes corresponding to shapes of the electronic devices. In recent years, the demand for a curved battery, including a flexible battery, has increased.

Such a lithium secondary battery is manufactured by fabricating a cathode and an anode, stacking them together with a separator to form an electrode assembly, and incorporating the electrode assembly together with an electrolyte solution into a secondary battery case.

The electrode of the secondary battery causes a sliding phenomenon by the coating of the electrode active material slurry during the manufacturing process, and thus, has different loadings depending on its position. Thereby, a sliding failure may occur in which the ratio of a cathode and an anode is reversed at the occurrence sites of sliding.

Moreover, when the cathode and the anode are assembled, the area of the cathode becomes larger than that of the anode, which results in an overhang failure in which the ratio of a cathode and an anode is reversed.

In the case of such a failure cell, as the cycle progresses, lithium precipitation is accelerated at the corresponding site. If lithium precipitation is excessive, it may lead to ignition. Therefore, in order to improve safety, it is necessary to select and eliminate cells with overhang or sliding failures before going to the field.

Conventionally, however, the cell had to be disassembled for such a determination, which is very inefficient in terms of processability and cost.

Therefore, there is an urgent need to develop a technique for detecting failure of a cell that can solve these problems.

DETAILED DESCRIPTION OF THE INVENTION

Technical Problem

It is an object of the present disclosure to provide a non-destructive method for detecting failure of a cell that can quickly detect overhang and sliding failures without disassembling the cell.

Technical Solution

According to one embodiment of the present disclosure, there is provided a non-destructive method for detecting failure of a cell, the method comprising the steps of:

(a) preparing a cell containing a carbon-based material as an anode active material;

(b) charging the cell; and (c) x-ray diffraction (XRD) scanning the charged cell inward from an end of an anode, wherein it is determined whether or not an $LiC_6$ peak of the anode is observed in a region after a signal of an anode current collector appeared in XRD scans.

Wherein, the cell charging in step (b) may be performed at 4V or higher.

Also, the step (c) may be performed once toward the inside at one end of the anode, or performed twice toward the inside at one end and toward the inside at the other end.

The observation of $LiC_6$ peak may be performed by measuring it by the $LiC_6$ peak intensity ($I_{LiC6}/(I_{LiC6}+I_{LiC12})$) relative to the sum of the $LiC_6$ peak intensity and the $LiC_{12}$ peak intensity.

At this time, it may be judged as a failure if the $LiC_6$ peak intensity of the anode in a region after the signal of the anode current collector appeared in XRD scans decreases from the end of the anode to the inside.

Alternatively, it may be judged as a failure if the $LiC_6$ peak is observed immediately after the signal of the anode current collector appeared in XRD scans. Specifically, it may be judged as a failure if a region is observed in which the $LiC_6$ peak intensity ($I_{LiC6}/(I_{LiC6}+I_{LiC12})$) relative to the sum of the $LiC_6$ peak intensity and the $LiC_{12}$ peak intensity is 0.3 or more immediately after the signal of the anode current collector appeared in XRD scans.

Alternatively, the cell charging in step (b) is performed at a state of charge (SOC) of 80% or more, and it may be determined as a failure if a region is observed in which the $LiC_6$ peak intensity ($I_{LiC6}/(I_{LiC6}+I_{LiC12})$) relative to the sum of the $LiC_6$ peak intensity and the $LiC_{12}$ peak intensity is 0.8 or more in a region immediately after the signal of the anode current collector appeared.

The cell failure may mean an overhanging cell or a sliding cell.

BRIEF DESCRIPTION OF THE DRAWINGS

FIG. 4 is a $LiC_6$ peak intensity graph by the state of charge SOC according to Experimental Example 1; and FIG. 5 is a graph of $LiC_6$ peak intensity and graphite d-spacing by the charged SOC according to Experimental Example 2.

DETAILED DESCRIPTION OF THE EMBODIMENTS

Figure 1:
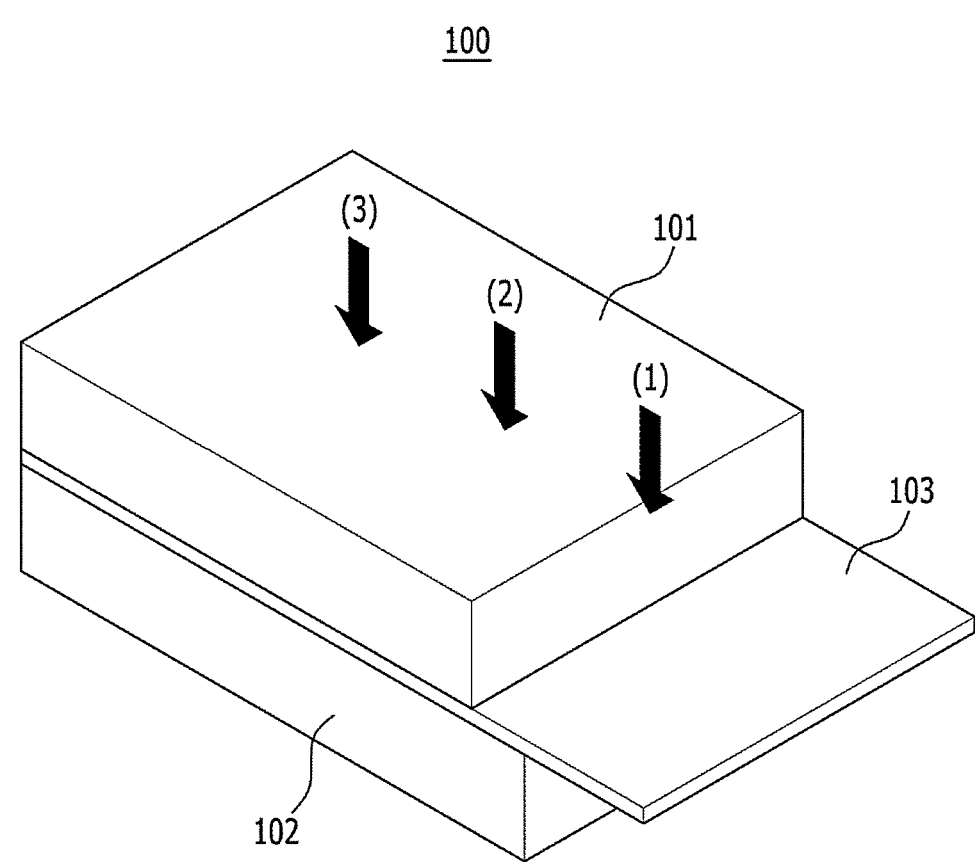
FIG. 1 is a perspective view schematically showing an overhang cell according to Comparative Example 1.

The terms and words used in the present specification and claims should not be interpreted as being limited to typical meanings or dictionary definitions, but should be interpreted as having meanings and concepts relevant to the technical scope of the present disclosure based on the rule according to which an inventor can appropriately define the terms and words as terms for describing most appropriately the best method the inventor knows for carrying out the invention. Accordingly, the embodiments described herein and the configurations shown in the drawings are only most preferable embodiments of the present disclosure and do not represent the entire spirit of the present disclosure, so it should be appreciated that there may be various equivalents and modifications that can replace the embodiments and the configurations at the time at which the present application is filed, and the scope of the present invention is not limited to the embodiments described below.

Hereinafter, the present disclosure will be described in detail with reference to the accompanying drawings. The terms or words used in the present specification and claims should not be construed as being limited to typical meanings or dictionary definitions, and the present disclosure should be construed with meanings and concepts that are consistent with the technical idea of the present disclosure based on the principle that the inventors may appropriately define concepts of the terms to appropriately describe their own disclosure in the best way.

Further, the embodiments described herein and the configurations shown in the drawings are only most preferable embodiments of the present disclosure and do not represent the entire spirit of the present disclosure, so it should be appreciated that there may be various equivalents and modifications that can replace the embodiments and the configurations at the time at which the present application is filed.

According to one embodiment of the present disclosure, there is provided a non-destructive method for detecting failure of a cell, the method comprising the steps of:

(a) preparing a cell containing a carbon-based material as an anode active material;

(b) charging the cell; and (c) x-ray diffraction (XRD) scanning the charged cell inward from an end of an anode, wherein it is determined whether or not an $LiC_6$ peak of the anode is observed in a region after a signal of an anode current collector appeared in XRD scans.

The cell failure may mean an overhanging cell or a sliding cell.

Figure 2:
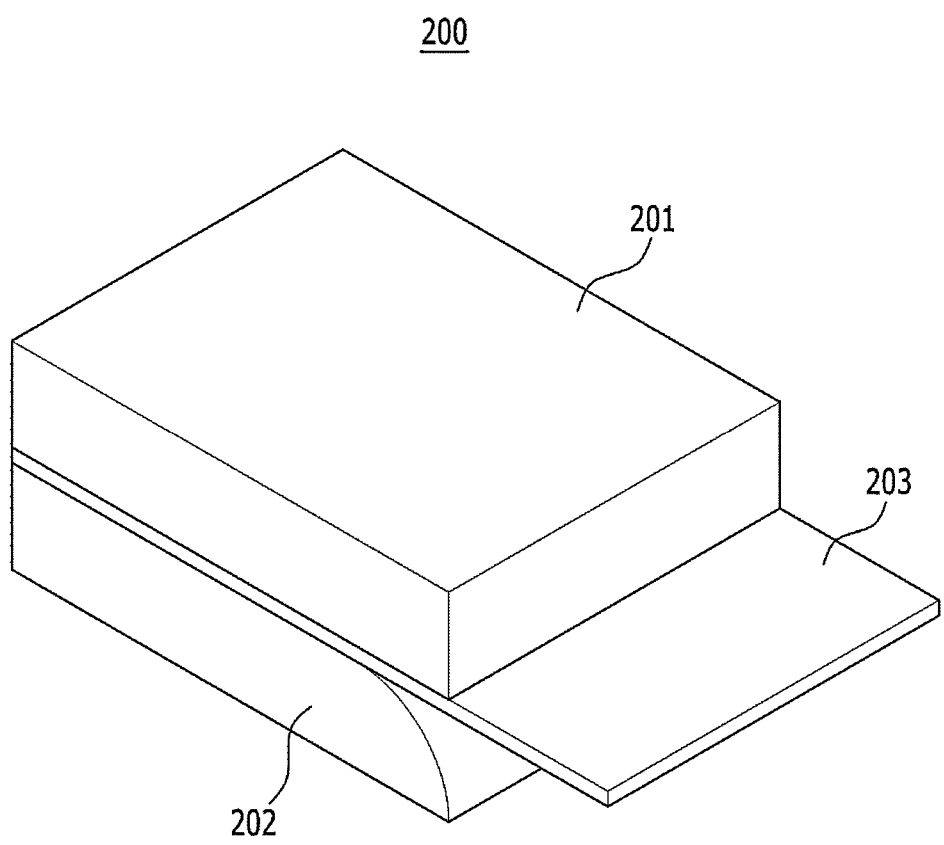
FIG. 2 is a perspective view schematically showing a sliding cell.

As described above, conventionally, there was no choice but to disassemble the cell and grasp assembly failures in order to judge cell failures such as an overhanging cell 100 in which the area of the cathode 102 at the end is formed larger than that of the anode 101 opposing via a separator 103 so that the ratio of the cathode and the anode is reversed as shown in FIG. 1, and a sliding cell 200 in which the end of the anode 202 slides due to the characteristics of the electrode according to the slurry coating, so that the loading of the anode 202 is lowered relative to that of the cathode 201 opposing via a separator 203 in the corresponding region as shown in FIG. 2.

However, this judging method requires a process of disassembling the cell, which is inefficient in terms of process and cost.

In this regard, the present inventors have conducted intensive research on a method of detecting such cell failures without disassembling the cell, and confirmed that by using in situ XRD analysis in a prescribed charge state of the cell, it is possible to select assembly failures such as overhang or sliding without disassembling the cell, thereby completing the present disclosure.

Specifically, when using an anode including a carbon-based material, especially graphite, a failure cell can be detected through observation of the $LiC_6$ peak.

In the case of graphite, it changes from the crystal structure of stage IV where lithium is not intercalated in the graphite layer when lithium is intercalated, to stage III where lithium is intercalated two by two at intervals with two graphite layers, stage II where lithium is intercalated one by one at intervals with one graphite layer, and stage I in which lithium is intercalated in all of the graphite layers when further charging is performed.

At this time, in the case of stage II where lithium is intercalated one by one at intervals with graphite layers, $LiC_{12}$ peak is observed in XRD, and in stage I where lithium is intercalated in all of the graphite layers, the $LiC_6$ peak is observed in XRD.

Figure 3:
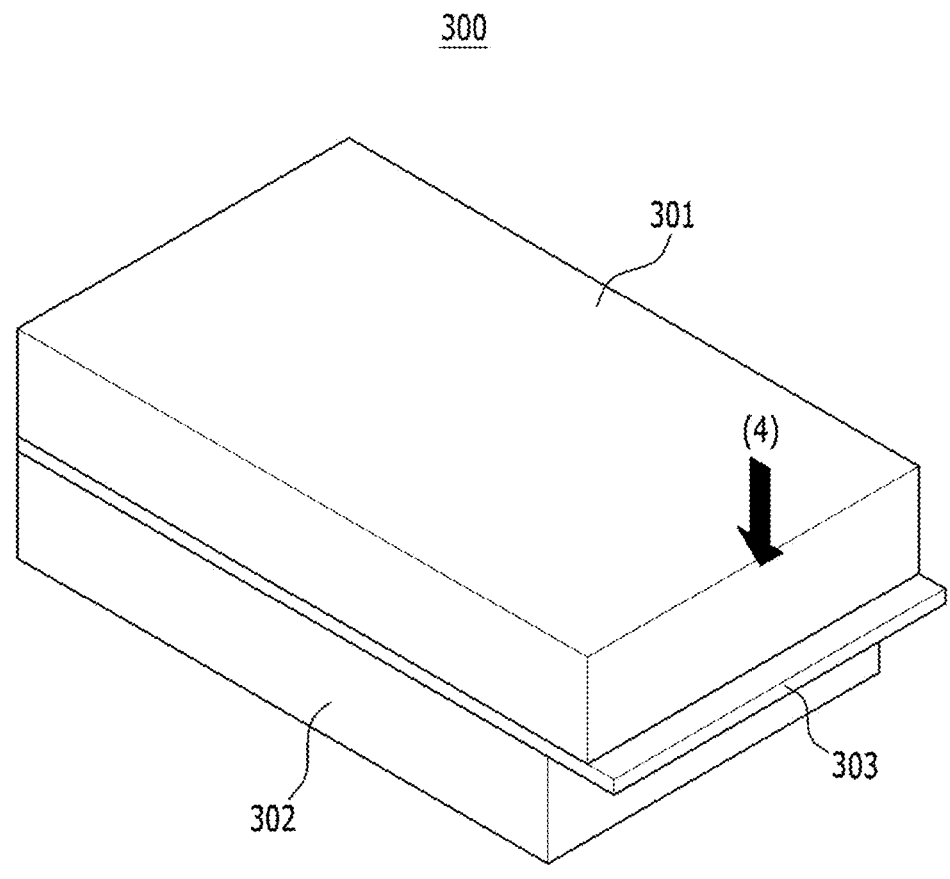
FIG. 3 is a perspective view schematically showing a normal cell according to Example 1.

Therefore, generally, as shown in FIG. 3, in the case of a well-assembled normal cell 300 in which the area of the anode 301 formed with the separator 303 interposed therebetween is wider than the area of the cathode 302, the edge of the anode is hardly charged during charging and therefore, the $LiC_6$ peak seen in the middle part during charging is not observed when the end of the anode is measured by XRD.

However, in the overhang cell or sliding cell as shown in FIGS. 1 and 2, the ratio of the anode and the cathode is reversed in the region of the anode end, so that the loading of the anode is lower than that of the cathode, whereby during charging, it becomes in a state of significant overcharge at the edge of the anode. Thus, the $LiC_6$ peak is observed quite clearly when the anode edge is measured by XRD.

More specifically, in overhang cells or sliding cells, it is observed that the $LiC_6$ peak intensity as the behavior of charging lithium into the anode at the end of the anode increases more rapidly than the $LiC_6$ peak intensity as the behavior of charging lithium into the anode in the middle part of the anode.

Therefore, based on this difference, the present disclosure can detect cell failures in a non-destructive manner, and can detect failures within 3 to 5 minutes, which is the in situ XRD measurement time, which is thus very efficient in terms of process and cost.

However, for the above observation, the anode should include a carbon-based material, especially graphite, as an anode active material.

Moreover, it can be judged on a cell in a state in which a charge has been made to some extent.

Therefore, the cell charging in step (b) may be performed at 4V or higher, and may be performed at SOC 50 or higher based on SOC.

Charging as described above causes sufficient lithium intercalation at the anode to the extent that the $LiC_6$ peak can be observed in the middle part, which is sufficient to judge the failure of the cell.

The in situ XRD measurement is performed on cells charged in this way without a separate disassembly process.

This XRD scan was performed at room temperature of 25° C., the output conditions of the X-ray were 60 kv and 35 mA, and the measurement method was performed in a static mode (2Theta: 7-14 degrees). The scanning time was fixed at 4-minute intervals simultaneously with the charging process.

This XRD scan is performed toward the inside at one end of the anode, which is because failures such as overhang or sliding occur at the end of the anode. More specifically, the step (c) may be performed once toward the inside at one end of the anode, or performed twice toward the inside at one end and toward the inside at the other end.

Since sliding or overhanging does not occur only at one end, the accuracy can be further increased by grasping the whole of both ends.

Thereby, an XRD scan is performed toward the inside at the end of the anode to confirm whether or not the $LiC_6$ peak of the anode is observed.

At this time, the signal of the anode current collector can be easily recognized because the peak of the metal used as the anode current collector is observed in XRD.

Specifically, the observation of the $LiC_6$ peak may be performed by measuring it by the $LiC_6$ peak intensity $(I_{LiC6}/(I_{LiC6}+I_{LiC12}))$ relative to the sum of the $LiC_6$ peak intensity and the $LiC_{12}$ peak intensity.

And, as an example of a method of detecting a failure based on this, specifically, it may be judged as a failure if the $LiC_6$ peak intensity of the anode in a region after the signal of the anode current collector appeared in XRD scans decreases from the end of the anode to the inside.

That is, in the case of an overhang or sliding cell, the $LiC_6$ peak intensity appears strongly at the end of the anode due to overcharging, and rather, the intensity tends to decrease toward the inside. On the other hand, in a normal cell, since lithium absorption and discharge do not occur at the end of the anode, the $LiC_6$ peak does not appear, and lithium is well intercalated toward the inside, so the $LiC_6$ peak intensity increases. From this, it is possible to detect whether or not a failure occurs.

Alternatively, it may be judged as a failure if the $LiC_6$ peak is observed immediately after the signal of the anode current collector appeared in XRD scans. More specifically, it may be judged as a failure if a region is observed in which the $LiC_6$ peak intensity $(I_{LiC6}/(I_{LiC6}+I_{LiC12}))$ relative to the sum of the $LiC_6$ peak intensity and the $LiC_{12}$ peak intensity is 0.3 or more, particularly more than 0.3, more particularly 0.3 to 0.9, immediately after the signal of the anode current collector appeared in XRD scans. On the other hand, when it shows a value close to 0, for example, less than 0.3, it is judged as a normal cell.

In other words, in the case of an overhang or a sliding cell, the $LiC_6$ peak intensity appears strongly at the end of the anode due to overcharging, whereas in a normal cell, lithium absorption and discharge do not occur at the end of the anode, and thus, the $LiC_6$ peak does not appear, so that a failure cell can be sufficiently detected simply by observing the $LiC_6$ peak at the end.

For the most accurate detection, the cell charging in step (b) is performed at SOC of 80% or more, and it is judged as a failure if a region is observed in which the $LiC_6$ peak intensity $(I_{LiC6}/(I_{LiC6}+I_{LiC12}))$ relative to the sum of the $LiC_6$ peak intensity and the $LiC_{12}$ peak intensity is 0.8 or more in a region immediately after the signal of the anode current collector appeared.

For overhangs or sliding cells, overcharging occurs at the end of the anode rather than in the normal region, that is, at the middle part inside the anode, and a shape in which lithium is concentrated to the extent that lithium is precipitated occurs. Therefore, the $LiC_6$ peak intensity at the end is very large.

On the other hand, in a normal cell, since lithium insertion occurs uniformly as a whole, there is no specific site where the $LiC_6$ peak intensity appears large. Therefore, it may be judged as a failure cell if a region is observed in which the $LiC_6$ peak intensity $(I_{LiC6}/(I_{LiC6}+I_{LiC12}))$ is 0.8 or more according to the XRD scan.

In this manner, according to the present disclosure, a cell failure can be judged in a very simple manner without disassembling the cell.

Hereinafter, the present disclosure will be described in more detail by way of examples.

Comparative Example 1

Artificial graphite as an anode active material, a binder (mixture of SBR and CMC in a weight ratio of 2:1), and carbon black as a conductive material were mixed at a weight ratio of 95:3.5:1.5, and the resulting mixture and water as a dispersion medium were used to prepare a slurry for an active material layer in which the mixture and the dispersion medium were at a weight ratio of 1:2.

Using a slot die, the slurry for the active material layer was coated onto one surface of a copper (Cu) thin film which is an anode current collector with a thickness of 10 μm, and dried under vacuum at 130° C. for 1 hour to form an active material layer. The active material layer thus formed was rolled by a roll pressing method to prepare an anode containing an active material layer having a thickness of 80 μm.

$LiNi_{0.4}Mn_{0.3}Co_{0.3}O_2$ a cathode active material, carbon black as a conductive material, and PVDF as a binder were mixed at a weight ratio of 92.5:3.5:4 in an N-methylpyrrolidone solvent to prepare a slurry for a cathode active material layer. Using a slot die, the slurry for the cathode active material layer was coated onto one surface of an aluminum (Al) thin film, which is a cathode current collector having a thickness of 10 μm, and dried under vacuum at 130° C. for 1 hour to form an active material layer. The active material layer thus formed was rolled by a roll pressing method to prepare a cathode containing an active material layer having a thickness of 80 μm.

A lithium secondary battery is manufactured by interposing a porous polyethylene separator between the cathode and the anode prepared as above to prepare an electrode assembly, positioning the electrode assembly in a case, and then injecting an electrolyte solution into the case.

At this time, both ends of the cathode were stacked so as to deviate from the end of the anode, so that an overhang cell in which the area of the cathode was larger than the area of the anode at one end as shown in FIG. 1 was prepared.

The electrolyte solution was prepared by dissolving lithium hexafluorophosphate $(LiPF_6)$ at a concentration of 1.15 M in an organic solvent composed of ethylene carbonate/dimethyl carbonate/ethyl methyl carbonate (mixed volume ratio of EC/DMC/EMC=3/4/3).

Example 1

When manufacturing the lithium secondary battery, both ends of the positive electrode were stacked so as to be positioned inside the both ends of the anode, so that a normal cell was prepared as shown in FIG. 3.

Experimental Example 1

The lithium secondary battery manufactured in Comparative Example 1 was subjected to XRD scanning while being charged at 1C up to 4.35V/38 mA under constant current/constant voltage (CC/CV) conditions at 25° C.

The XRD scan was performed at a room temperature of 25° C., the X-ray output conditions were 60 kv and 35 mA, and the measurement method was performed in static mode (2Theta: 7-14 degrees). The scan time was fixed at 4-minute intervals simultaneously with the charging process.

According to the state of charge, the $LiC_6$ peak intensity $(I_{LiC6}/(I_{LiC6}+I_{LiC12}))$ relative to the sum of the $LiC_6$ peak intensity and the $LiC_{12}$ peak intensity in the regions (1), (2) and (3) of FIG. 1 was determined, and shown in FIG. 4 below.

The $LiC_6$ peak intensity $(I_{LiC6}/(I_{LiC6}+I_{LiC12}))$ relative to the sum of the $LiC_6$ peak intensity and the $LiC_{12}$ peak intensity can be determined by calculating the area of the peak defined by $LiC_6$ and the area of the peak defined by $LiC_{12}$, and then calculating their ratio.

In FIG. 4, the $LiC_6$ peak intensity in (1) of FIG. 1 is shown in red, the $LiC_6$ peak intensity in (2) is shown in yellow, and the $LiC_6$ peak intensity in (3) is shown in blue.

Experimental Example 2

The lithium secondary battery prepared in Example 1 was subjected to XRD scanning while being charged at 1C up to 4.35V/38 mA under constant current/constant voltage (CC/CV) conditions at 25° C.

The XRD scan was performed at a room temperature of 25° C., the X-ray output conditions were 60 kv and 35 mA, and the measurement method was performed in a static mode (2Theta: 7-14 degrees). The scan time was fixed at 4-minute intervals simultaneously with the charging process.

At this time, according to the state of charge, the $LiC_6$ peak intensity $(I_{LiC6}/(I_{LiC6}+I_{LiC12}))$ relative to the sum of the $LiC_6$ peak intensity and the $LiC_{12}$ peak intensity in the region (4) of FIG. 3, and the interlayer spacing of graphite 001, that is, the crystal lattice value, were determined and shown in FIG. 5 below.

Reviewing Experimental Example 1 and Experimental Example 2, it can be confirmed that in the case of the overhang cell, the $LiC_6$ peak intensity increases sharply as charging progresses in the region (1) in FIG. 1, that is, at the edge of the anode, and shows a value of 0.8 or higher at SOC of 80% or more, whereas it can be confirmed that in the case of a normal cell, the $LiC_6$ peak is not observed in the region (4) of FIG. 3, that is, at the edge of the anode even if charging progresses.

Therefore, these experiments allow the detection of normal cells and failure cells to without disassembling the cells through these experiments.

Although the exemplary embodiments of the present disclosure have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The non-destructive method for detecting failure of a cell according to the present disclosure can quickly detect an overhang or sliding cell failure without disassembling the cell by using a very simple method of measuring a cell in which charging has been performed by XRD and observing the $LiC_6$ peak at the end of the anode where overhang or sliding may occur, which is thus efficient in terms of processability and cost.

The invention claimed is:

1. A non-destructive method for detecting failure of a cell, the method comprising:

preparing a cell containing a carbon-based material as an anode active material;

charging the cell;

x-ray diffraction (XRD) scanning the charged cell inward from an end of an anode of the charged cell; and determining whether or not an $LiC_6$ peak of the anode is observed in a region after a signal of an anode current collector appears in XRD scans, wherein the determining comprises detecting a cell failure if the $LiC_6$ peak is observed immediately after the signal of the anode current collector appears in the XRD scans, and wherein the detecting the cell failure is used to eliminate the cell with the cell failure from deployment.

2. The non-destructive method of claim 1, wherein:

the charging the cell is performed at 4 volts (V) or higher.

3. The non-destructive method of claim 1, wherein:

the XRD scanning is performed once toward an inner region of the anode from the end of the anode, or performed at least once toward the inner region from the end of the anode and at least once toward the inner region from another end of the anode.

4. The non-destructive method of claim 1, wherein:

the detecting the cell failure comprises detecting the cell failure if the region is observed in which an $LiC_6$ peak intensity relative to a sum of the $LiC_6$ peak intensity and an $LiC_{12}$ peak intensity $(I_{LiC6}/(I_{LiC6}+I_{LiC12}))$ is 0.3 or more immediately after the signal of the anode current collector appears in the XRD scans.

5. The non-destructive method of claim 1, wherein:

the cell is an overhanging cell or a sliding cell.

6. The non-destructive method of claim 5, wherein:

for the overhanging cell, an area of a cathode is formed larger than an area of the anode; and for the sliding cell, the end of the anode slides so that loading of the anode is lowered relative to loading of a cathode in a corresponding region.

7. The non-destructive method of claim 1, wherein the cell failure is an overhang or sliding cell failure.

8. The non-destructive method of claim 1, wherein the observation of the $LiC_6$ peak is performed by measuring the $LiC_6$ peak by an $LiC_6$ peak intensity relative to a sum of the $LiC_6$ peak intensity and an $LiC_{12}$ peak intensity $(I_{LiC6}/(I_{LiC6}+I_{LiC12}))$.

9. A non-destructive method for detecting failure of a cell, the method comprising:

preparing a cell containing a carbon-based material as an anode active material;

charging the cell;

x-ray diffraction (XRD) scanning the charged cell inward from an end of an anode of the charged cell; and determining whether or not an $LiC_6$ peak of the anode is observed in a region after a signal of an anode current collector appears in XRD scans, wherein the determining comprises detecting a cell failure if the region is observed in which an $LiC_6$ peak intensity relative to a sum of the $LiC_6$ peak intensity and an $LiC_{12}$ peak intensity $(I_{LiC6}/(I_{LiC6}+I_{LiC12}))$ is 0.8 or more in the region immediately after the signal of the anode current collector appears, and wherein the detecting the cell failure is used to eliminate the cell with the cell failure from deployment.

10. A non-destructive method for detecting failure of a cell, the method comprising:

preparing a cell containing a carbon-based material as an anode active material;

charging the cell;

x-ray diffraction (XRD) scanning the charged cell inward from an end of an anode of the charged cell; and determining whether or not an $LiC_6$ peak of the anode is observed in a region after a signal of an anode current collector appears in XRD scans, wherein the observation of the $LiC_6$ peak is performed by measuring the $LiC_6$ peak by an $LiC_6$ peak intensity relative to a sum of the $LiC_6$ peak intensity and an $LiC_{12}$ peak intensity ($I_{LiC6}/(I_{LiC6}+I_{LiC12})$), wherein the determining comprises detecting a cell failure, and wherein the detecting the cell failure is used to eliminate the cell with the cell failure from deployment.

11. The non-destructive method of claim 10, wherein:

the determining comprises detecting the cell failure if the $LiC_6$ peak intensity of the anode in the region after the signal of the anode current collector appears in the XRD scans decreases from the end of the anode to an inner region of the anode.

12. The non-destructive method of claim 9, wherein the charging the cell is performed at a state of charge (SOC) of 80% or more.

\* \* \* \* \*